US007099358B1

(12) United States Patent
Chong

(10) Patent No.: US 7,099,358 B1
(45) Date of Patent: Aug. 29, 2006

(54) TUNABLE LASER LIGHT SOURCE

(75) Inventor: Changho Chong, Kasugai (JP)

(73) Assignee: Santec Corporation, Komaki (JP)

( * ) Notice: Subject to any disclaimer, the term of this patent is extended or adjusted under 35 U.S.C. 154(b) by 0 days.

(21) Appl. No.: 11/340,495

(22) Filed: Jan. 27, 2006

(30) Foreign Application Priority Data

Aug. 5, 2005 (JP) ............................. 2005-227543

(51) Int. Cl.
*H01S 3/10* (2006.01)
*H01S 3/08* (2006.01)

(52) U.S. Cl. ..................... 372/20; 372/100; 372/102
(58) Field of Classification Search ................. 372/20, 372/99, 100, 102
See application file for complete search history.

(56) References Cited

U.S. PATENT DOCUMENTS

| 4,229,710 A | * | 10/1980 | Shoshan ................... 372/102 |
| 4,600,837 A | * | 7/1986 | DiStefano et al. .......... 250/235 |
| 4,868,834 A | * | 9/1989 | Fox et al. ................. 372/20 |
| 5,185,660 A | * | 2/1993 | Um .......................... 348/755 |
| 5,550,850 A | * | 8/1996 | Lee et al. ................. 372/20 |
| 5,638,396 A | * | 6/1997 | Klimek ..................... 372/92 |
| 6,160,826 A | | 12/2000 | Swanson et al. |
| 6,463,085 B1 | * | 10/2002 | Tayebati ................... 372/20 |
| 6,810,047 B1 | * | 10/2004 | Oh et al. .................. 372/100 |
| 2005/0035295 A1 | | 2/2005 | Bouma et al. |
| 2005/0231651 A1 | * | 10/2005 | Myers et al. .............. 348/744 |
| 2006/0056464 A1 | * | 3/2006 | Chong ...................... 372/6 |

OTHER PUBLICATIONS

Yamashita, S. et al., Widely Tunable Erblum-Doped Fiber Ring Laser Covering Both C-Band and L-Band, IEEE Journal on Selected Topics in Quantum Electronics, Jan./Feb. 2001, pp. 41-43, vol. 7, No. 1.

* cited by examiner

*Primary Examiner*—James Menefee
(74) *Attorney, Agent, or Firm*—Smith Patent Office

(57) ABSTRACT

A gain medium 12 and a tunable filter are provided in an optical path of laser oscillation. The tunable filter has an optical beam deflector for periodically changing an optical beam at a constant angular speed, a prism 26 on which deflected light is made incident, and a diffraction grating 27. Appropriate selection of the apex angle α of the prism 26 and an angle β formed by the prism 26 and the diffraction grating 27 can provide a tunable laser light source for changing the oscillation frequency at high speed and a constant variation rate.

11 Claims, 12 Drawing Sheets

TUNABLE LASER LIGHT SOURCE

BACKGROUND OF THE INVENTION

1. Field of the Invention

The present invention relates to a tunable laser light source, which generates monochromatic light to scan continuously in a wavelength range at a constant variation rate thereof.

2. Discussion of the Related Art

Hitherto, as a light source of an analyzer for analyzing an object to be measured by irradiating the object with light, a light source of a wide bandwidth is used. In spectral analysis, there is widely used a method of projecting light of a wide bandwidth to an object to be measured, spatially decomposing reflection light or transmission light of the projected light to wavelength components by a grating or the like, Fourier-analyzing the frequency components by an interferometer, and making an analysis. As a light source used in such a method, for example, a white light source, an ASE light source using an erbium doped fiber (EDF), or the like is used. In such spectral analysis, however, the intensity and density of the light from the light source with respect to the wavelength is low, and those of light which is used in spectral analysis is also low. Consequently, the light source has a drawback such that even if Fourier transformation is performed, a light signal cannot be detected due to noise, and it is difficult to carry out the analysis.

Another method uses, as the light source of the analyzer, a tunable light source for emitting light of a single spectrum of high power density in which wavelength changes in a desired bandwidth. The light source emits a strong single spectrum light beam to an object to be measured while changing the wavelength of the light beam, so that the light beam passes through the object or reflection light of the light beam is directly received by a light detecting element. In the method, the intensity and density of the optical output with respect to the wavelength of the light source is high, so that the level of detected light and a S/N ratio are sufficiently high and sufficiently high measurement precision can be realized.

YAMASHITA ET AL., IEEE JOURNAL ON SELECTED TOPICS IN QUANTUM ELECTRONICS, VOL. 7, No. 1 January/February 2001, PP41 to 43 shows another conventional tunable light source of a ring laser using an erbium doped fiber. The tunable light source is obtained by using the erbium doped fiber (EDF) and a fiber amplifier for exciting the fiber as a gain medium, providing a bandpass filter of a tunable type in the optical fiber loop, and changing the wavelength of the bandpass filter. In this case, the length of a resonator of the optical fiber loop can be set to be long such as 30 m, so that the interval between longitudinal mode can be narrowed. Consequently, without changing the length of the resonator, the influence of mode hopping can be eliminated. Thus, although it is, strictly, not single mode oscillation but only by changing the wavelength to be selected of the bandpass filter, virtually continuously wavelength change can be achieved.

US 2005/0055295A1 discloses a tunable filter combining together a diffraction grating, a lens system, and a polygon mirror, and proposes a tunable light source using this filter.

SUMMARY OF THE INVENTION

It is possible to provide a tunable light source for continuously and repetitively scanning over a wide range of wavelength by use of a tunable filter. In an optical coherent tomography (OCT) using a tunable light source, in order to generate a two-dimensional image, for example, it has been conventionally required to obtain, for example, 1024 points at equal frequency intervals in accordance with the resolution of an image during one wavelength scanning and then provide it as a timing signal for performing Fourier transformation. This signal is usually called k trigger. As a method of generating this k trigger signal, part of an output from the light source is made diverge by a fiber coupler or the like, then an etalon having the same free spectral range (FSR) as the sampling frequency interval is provided so that the light is received by a photo diode therethrough, and then a spike response of the signal thereof is converted into a rectangular trigger signal. The interval Δk of a trigger signal is proportional to an observation depth range. A smaller interval permits deeper analysis. This interval Δk of a trigger signal needs to be an equal frequency interval. If the interval Δk is not an equal frequency interval, a problem, such as a distorted image or susceptibility to noise, arises.

To use a tunable light source as a light source of an analyzer, it is required to change the wavelength at high speed and to narrow down the oscillation spectrum width, which requires a band pass filter to have properties in accordance with such changes. For example, in the OCT system described above, since a capability of high-speed scanning permits high-speed image processing, blood stream observation, and dynamic analysis of oxygen saturation concentration change and the like, such a device is required. However, no tunable laser light source has been put into practice which permits such high-speed scanning as to follow the frame rate of image display. Moreover, a light source capable of scanning the frequency at a fixed variation rate facilitates signal processing; however, there has been no such a light source.

In view of the problem described above, it is an object of the present invention to provide a tunable light source which achieves high-speed scanning and wide band variation, and which is capable of scanning an oscillation frequency at a fixed variation rate.

A tunable laser light source of the present invention comprises: an optical path for laser oscillation; a gain medium which is provided in the optical path and which has a gain in an oscillating wavelength; and a tunable optical filter which is arranged in said optical path and which selects a continuously changing wavelength. The tunable optical filter comprises: an optical beam deflector for periodically deflecting an optical beam over a predetermined rage at a constant angular speed; a prism on which light deflected by said optical beam deflector is made incident; and a diffraction grating on which light emerging from said prism is made incident and which reflects light of a selected wavelength in a direction same as an incidence direction, the selected wavelength changing in accordance with an incidence angle. Values of an apex angle α of said prism and an angle β formed by said prism and said diffraction grating are selected so that, when an oscillation frequency is represented as a function $f(\theta)$ of an incidence angle $\theta$ on said prism, a difference thereof from a linear approximation formula $f_L(\theta)$ is smaller than that when said prism is not used.

According to one aspect of the present invention having such features, the oscillation wavelength is changed by use of the tunable filter in the optical path of a resonator in laser oscillation. In the tunable filter an optical beam deflector deflects light and makes the light incident on the diffraction grating via the prism. The diffraction grating is used as a filter in which the wavelength changes in accordance with an incidence angle and reflects the light in the same direction as incidence light. Consequently, the tunable filter forms part of an optical path, thus permitting the oscillation wavelength to be determined by a wavelength selected. The laser light source changes the incidence angle on the diffraction grating continuously at a constant angular speed, then changes the selected wavelength of the tunable filter continuously the thereby permits a change in the oscillation wavelength. Moreover, selecting the apex angle of the prism and the angle formed by the prism and the diffraction grating permits scanning the frequency at a fixed variation rate. Further, providing a sufficiently high deflection speed of the optical beam deflector brings an effect that wavelength scanning can be performed at high speed. When this light source is used for an OCT, sampling can be easily performed at equal intervals on the frequency axis, thus providing a cross sectional image with little distortion and noise.

DESCRIPTION OF THE PREFERRED EMBODIMENTS

First Embodiment

Figure 1:
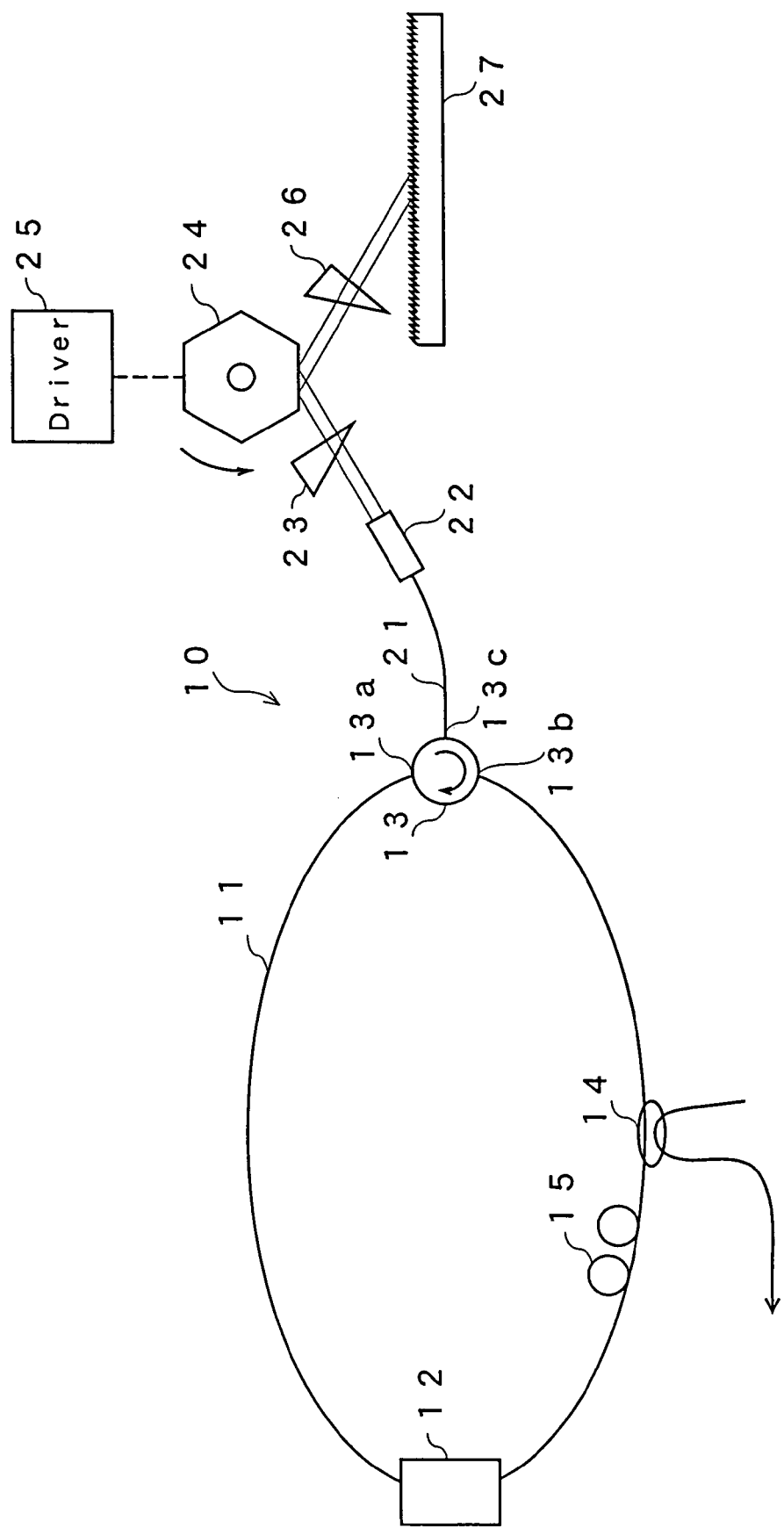
FIG. 1 is a schematic diagram showing a tunable fiber laser light source according to a first embodiment of the present invention.

FIG. 1 is a schematic view showing the configuration of a tunable fiber laser light source according to a first embodiment of the present invention. A tunable fiber laser light source 10 of this embodiment forms a loop by including an optical fiber 11. In a part of the loop, a semiconductor optical amplifier as a gain medium 12, an optical circulator 13, an optical coupler 14 and a polarization controller 15 are provided. The optical circulator 13 regulates the direction of light passing through the optical fiber 11 to the arrow direction as shown in the figure. Specifically, input terminals 13a and 13b of the optical circulator 13 are connected to the optical fiber loop and incidence light from the input terminal 13a is emitted from a terminal 13c of the optical circulator 13. Incidence light from the terminal 13c of the optical circulator 13 is emitted from the terminal 13b. The incidence light from the terminal 13b is emitted from the terminal 13a. The optical coupler 14 extracts a part of light of the optical fiber loop, and the polarization controller 15 regulates the polarization state of light passing through the optical fiber loop to a predetermined state.

The terminal 13c of the optical circulator 13 is connected to a collimate lens 22 via an optical fiber 21 as shown in FIG. 1. The collimate lens 22 collimates light from the optical fiber 21 into a parallel light and is provided with a prism 23 and polygon mirror 24 on an optical axis thereof. A driver 25 rotates the polygon mirror 24 on an axis vertical to a paper surface as shown in the figure so as to change the angle of the parallel light within a range at a constant angular speed and reflect the light. The prism 23 enlarges a diameter of a beam projected from the collimate lens 22. When the beam diameter of an optical beam from the collimate lens 22 is $W_1$, the optical beam diameter is enlarged to $W_2$ by the prism 23. The optical beam diameter of the light reflected in the polygon mirror 24 which is further enlarged to $W_3$ by a prism 26, and then added to the diffraction grating 27. The optical beam diameter of the incidence light with respect to the diffraction grating 27 can be thus enlarged.

The diffraction grating 27 is a grating provided with a sectional surface having a saw-tooth waveform consecutively formed thereon at a constant pitch. The embodiment of the present invention provides a constitution that incidence light returns in an incident direction through a same light path when an incident direction is changed by a Littrow arrangement. An incidence angle selects a wavelength to be selected. The wavelength to be selected is set in, for example, a range of 1260 to 1360 nm in the present embodiment. The polygon mirror 24 and the driver 25 constitute an optical beam deflector which periodically and continuously changes an angle of an optical beam within a certain range at the constant angular speed. The optical beam deflector and the diffraction grating 27 constitute the wavelength variable, namely tunable filter.

Figure 2:
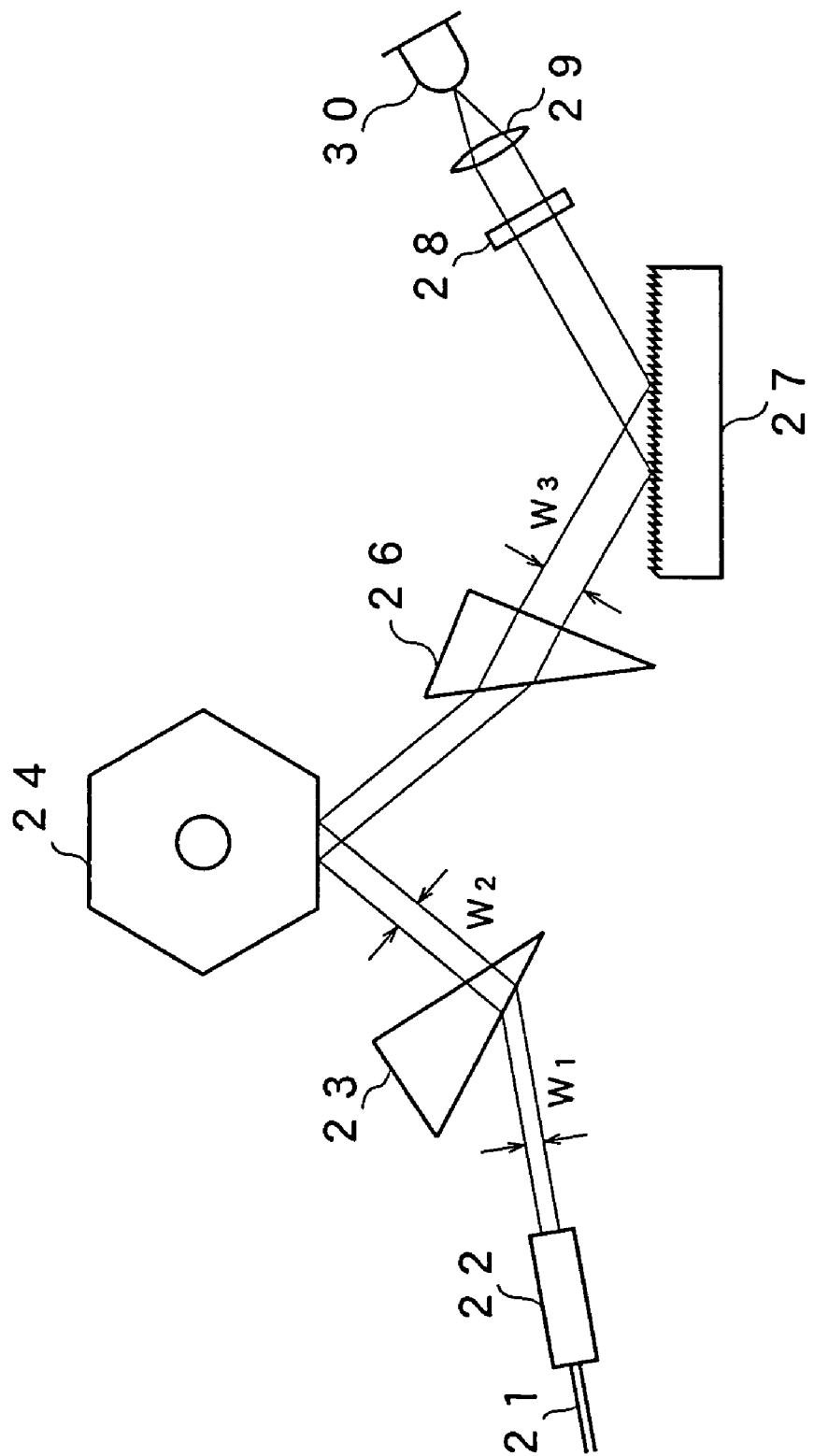
FIG. 2 is a schematic diagram showing a tunable filter of the tunable fiber laser light source according to the present embodiment.

As shown in FIG. 2 though omitted from FIG. 1, at the position where primary reflective light reflected on the diffraction grating 27 is received from one side of the deflection range, there are provided an optical filter 28, a lens 29, and a photodiode 30. The optical filter 28 is an optical bandpass filter that permits only light oscillating at this angle to pass therethrough. The photodiode 30 is a light receiving element that receives this light to thereby obtain a trigger signal of a start point of a wavelength scanning.

The Littrow arrangement will be described. When the incidence angle of the optical beam with respect to the diffraction grating is γ and a reflection angle is δ, diffracted light is obtained by the following formula.

$$\Lambda(\sin\gamma + \sin\delta)k\lambda \qquad (1)$$

Herein, k is an order and takes values of 0, ±1, ±2 . . . There are Littrow and Littmann arrangements in the diffracted light. In the Littrow arrangement, angles of the first order diffracted light and incidence light are equal. Therefore, when γ=δ−1 in the formula (1), based on the formula (1), the wavelength of the diffracted light is determined by the following formula.

$$\lambda = 2\Lambda \sin\gamma \qquad (2)$$

Herein, Λ is a pitch (μm) of the grating, that is, an inverse number of the number of grating lines a (lines/mm) per unit length. Incidentally, in the Littmann arrangement, the angles of the incidence light and reflection light are not equal.

It is necessary to select, for a length of an optical fiber loop, such a length as to include a plurality of vertical modes in a full width at half maximum of a bandpass filter by means of the diffraction grating. The number of the vertical modes is preferably at least 10, more preferably at least 100, in fact, the more, the more preferable. However, it is necessary to extend the optical fiber in order to provide more vertical modes, which necessitates the use of an optical fiber having a length of several to tens of meters in practical use.

Figure 3A:
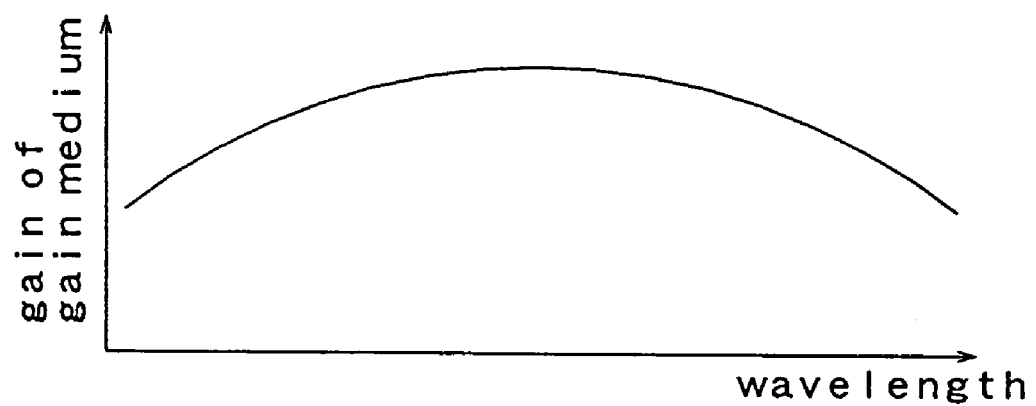
FIG. 3A is a graph showing a gain of a gain medium of an optical fiber laser light source according to the first embodiment.
Figure 3B:
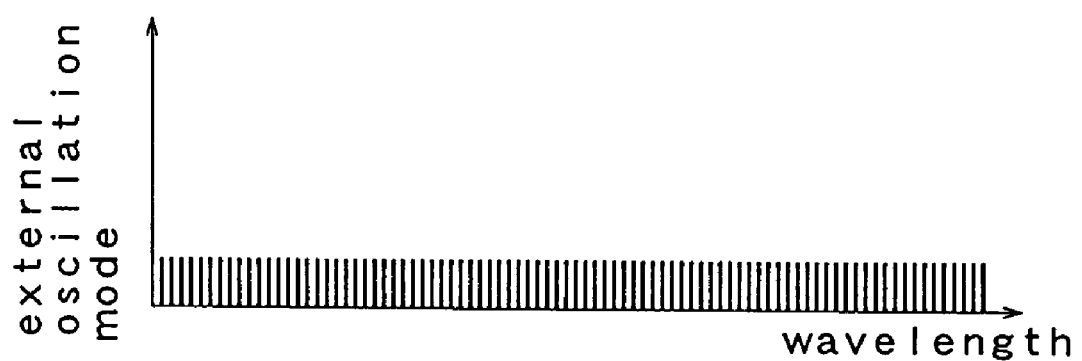
FIG. 3B is a graph showing an oscillation mode.
Figure 3C:
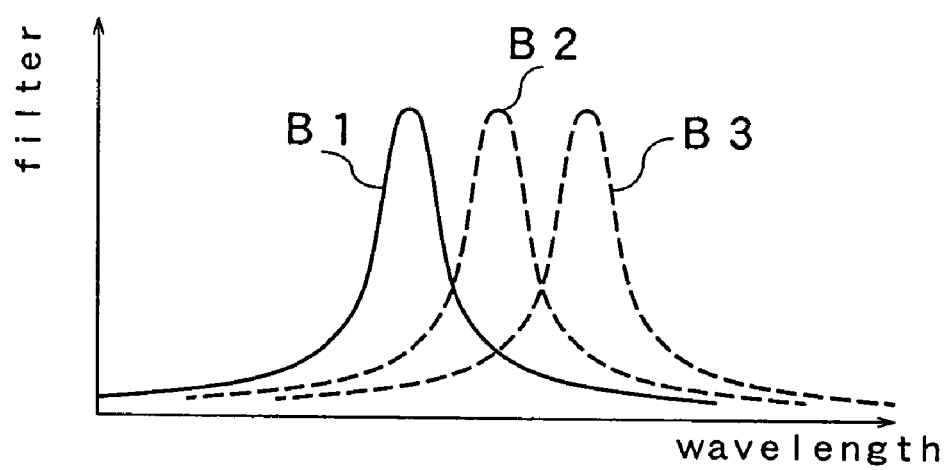
FIG. 3C is a graph showing characteristics of a band path filter.
Figure 3D:
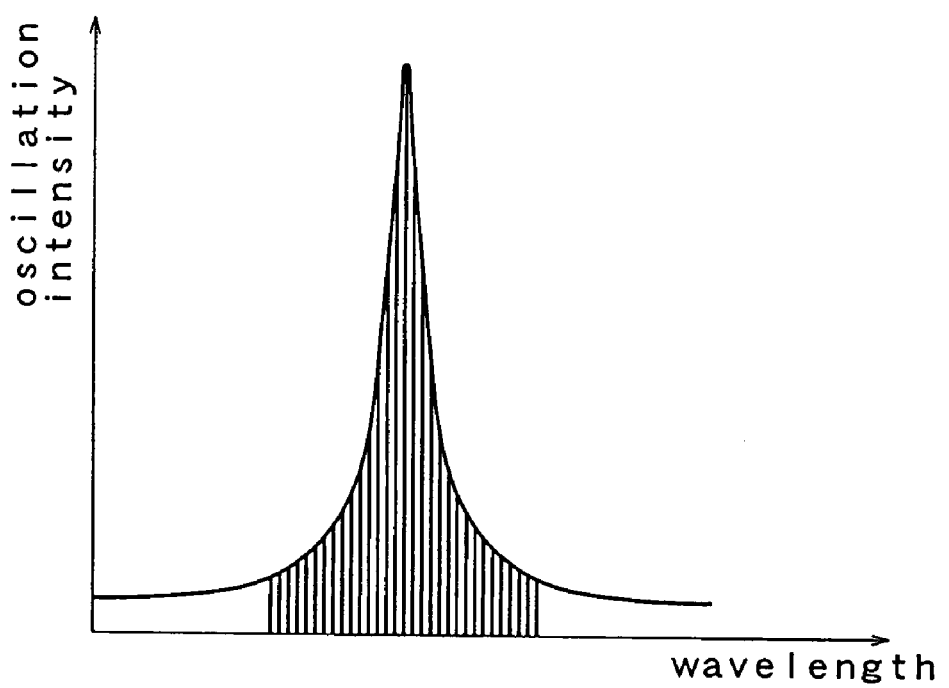
FIG. 3D is a graph showing an oscillation output.

Now, an operation of this embodiment will be described. In the embodiment, the gain medium 12, the semiconductor optical amplifier is driven. FIG. 3A shows a gain of the gain medium 12. Thus, operation of the optical circulator 13 causes light added from the terminal 13a to input into the optical fiber 21 from the terminal 13b, and then the collimate lens 22 collimates the light into parallel light. Then, the light reflected at an angle determined by a rotation angle of the polygon mirror 24 is added to the diffraction grating 27. The reflected light selected by the Littrow arrangement of the diffraction grating 27 is directly reflected in the same direction and is added to the collimate lens 22 via the polygon mirror 24. Further, the reflected light is added to the optical fiber loop from the optical circulator 13 via the optical fiber 21. The polarization controller 15 adjusts a polarization of the light transmitting through the optical fiber loop in a predetermined direction. FIG. 3B shows an external cavity vertical mode determined in accordance with an optical length decided by the length of the optical fiber loop and a refractive index of the optical fiber. For example, when the optical length is 30 m, intervals of the vertical modes becomes approximately 10 MHz. FIG. 3C shows a characteristic B1 of the diffraction grating 27. The diffraction grating 27 selects the light from the polygon mirror 24, thereby oscillating the light in a multiple mode with a plurality of vertical modes included as shown in FIG. 3D. The oscillation wavelength is, for example, 1260 nm. A part of the laser light thus oscillated in the optical fiber loop, for example, the light equivalent to 90% of the laser light is retrieved via the optical coupler 14. An optical signal of the multi-mode oscillation raises a problem when used as a light of optical wavelength division multiplexing communication. The optical signal, however, is acceptable as long as a spectral line width (to be strict, half-value width of an envelope of the spectrum at the time of the multi-mode oscillation) is sufficiently narrower than a resolution of a subject to be measured in the case of a spectral analysis, optical fiber sensing, evaluation of optical components.

Figure 4:
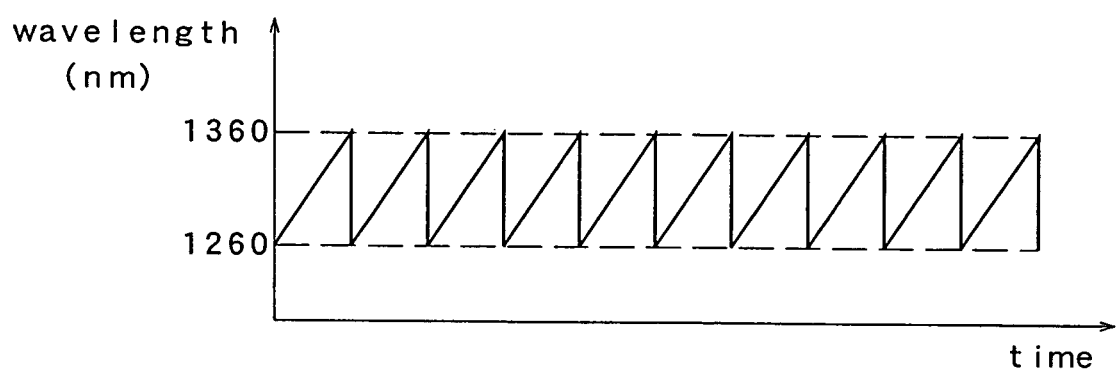
FIG. 4 is a graph showing the temporal variation in the oscillation wavelength of the present embodiment.

Then, the driver 25 rotates the polygon mirror 24. This changes an incidence angle to the diffraction grating 27, thereby changing the selected wavelength continuously as shown in from B1 to B3 in FIG. 3C. Therefore, rotation of the polygon mirror 24 causes the oscillation wavelength to change into sawtooth waveform as shown in FIG. 4.

The oscillation according to this embodiment becomes an oscillation in the multiple mode manner as shown in FIG. 3D. Here, the intervals between the vertical modes are extremely narrow as shown in FIG. 3B, when a wavelength is changing, the oscillation mode is continuously shifted in an envelope shape. The wavelength can be thus continuously changed without mode hopping. In this case, the rotation of polygon mirror 24 permits the selected wavelength to change at high scanning velocity within a range of, for example, 100 nm. For instance, if the rotation velocity of the polygon mirror 24 is 30000 rpm and the number of reflecting faces of the polygon mirror 24 is 12, the oscillation wavelength of the fiber laser light source changes at a scanning velocity of 15.4 KHz.

Figure 5:
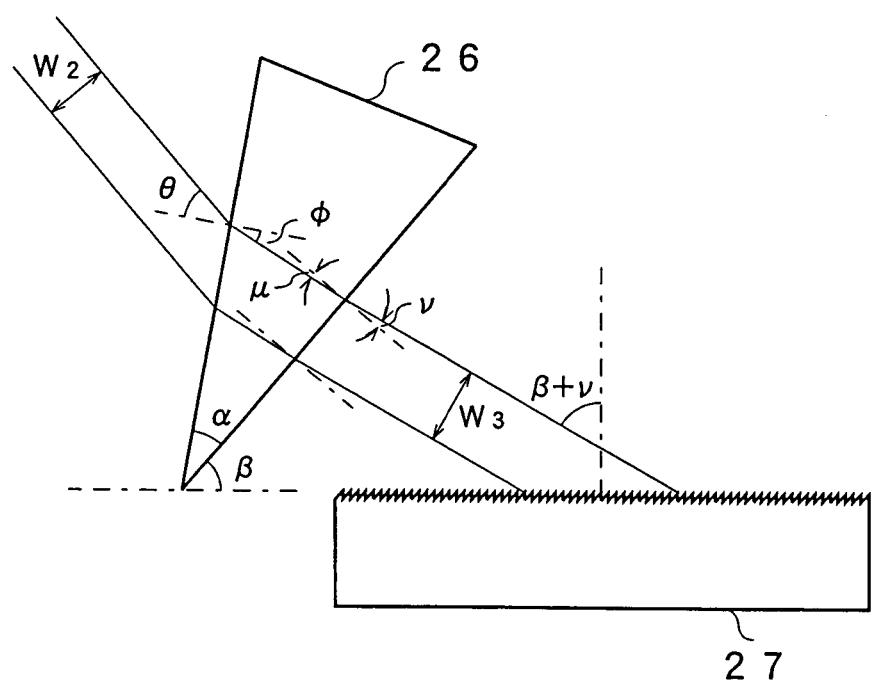
FIG. 5 is an enlarged view showing a prism and a diffraction grating.

FIG. 5 is an enlarged view of the prism 26 and the diffraction grating 27, wherein an incidence angle and a refraction angle with respect to a first surface of the prism 26 are respectively θ and φ, and an incidence angle and an outgoing angle with respect to a second surface of the prism 26 are respectively μ and ν. An apex angle of the prism 26 is α, and the prism is disposed at an angle position of β relative to the diffraction grating 27. In this case, the incidence angle with respect to the diffraction grating 27 is (β+ν) because of the refraction shown in the figure. A wavelength λ selected by the diffraction grating 27 is represented by the following formula.

$$\lambda = 2\Lambda \sin(\beta + \nu) \qquad (3)$$

A bandwidth in Full-Width-Half-Maximum (FWHM) Δλ of the wavelength selected by the diffraction grating is obtained by the following formula.

$$\Delta\lambda = \lambda^2 / \{2W \tan(\beta+\nu)\} \qquad (4)$$

Herein, W is an optical beam diameter of the light added to the diffraction grating 27, and (β+ν) is an incidence angle with respect to the diffraction grating. As is clear from the formula (3), the selected wavelength is longer as the incidence angle is larger, while the small incidence angle results in short wavelength. As shown in FIG. 5, when the incidence angle is larger, the optical beam diameter projected on the surface of the diffraction grating is also larger. Therefore, when it is assumed that the $\lambda^2$ is substantially constant, the bandwidth Δλ is wider as the wavelength is shorter.

In order for the bandwidth to be constant, the optical beam diameter W of the incidence light is changed in accordance with the wavelength. The prism 23 serves to enlarge an original optical beam diameter $W_1$ of the incidence light to $W_2$. The prism 26 serves to enlarge the optical beam diameter $W_2$ obtained via the polygon mirror 24 to $W_3$. When the enlarged optical beam diameter $W_3$ is provided for the above formula (4) as a replacement, the half-value width is determined. The optical beam diameter $W_3$ obtained by the prism 26 is given from the following formula when an enlargement rate is $M_2$.

$$W_3 = M_2 W_2 \quad (5)$$

The enlargement rate $M_2$ is obtained from the following formula.

$$M_2 = (\cos\phi \cdot \cos\nu)/(\cos\theta \cdot \cos\mu) \quad (6)$$

The wavelength selected by the diffraction grating 27 changes in the form of a sine wave with respect to an incident angel γ, as indicated by formula (2). Thus, the oscillation wavelength changes in the form of a sine wave with respect to the time axis while the angle of optical beam deflection at the optical beam deflector changes at the constant angular speed.

To use this light source for an optical coherent tomography (OCT), an interference signal is sampled on the frequency domain. Thus, it is required to output and process light from the light source at each frequency interval by use of a trigger signal that is provided linearly or at equal intervals on the frequency domain. Such a trigger signal provided at equal frequency intervals is referred to as a k trigger. Fourier transformation is performed by processing an interference signal measured at the timing of a k trigger signal provided at equal frequency intervals. If the scanning frequency is linear with respect to the time axis, sampling on the time axis at equal intervals is satisfactory. In this case, only sampling at equal intervals by a clock inside a processing circuit board is required; therefore, an optical system for generating a k trigger signal, processing of interpolation to the frequency domain, a noise cut circuit, and the like are all no longer required. Moreover, since there is no need for buffering data for the purpose of interpolation processing described above, real-time image processing and display can be performed at a speed determined by the wavelength scanning rate. Further, since there is no need for making output light diverge outward, the optical output can be utilized not uselessly but efficiently.

Figure 6:
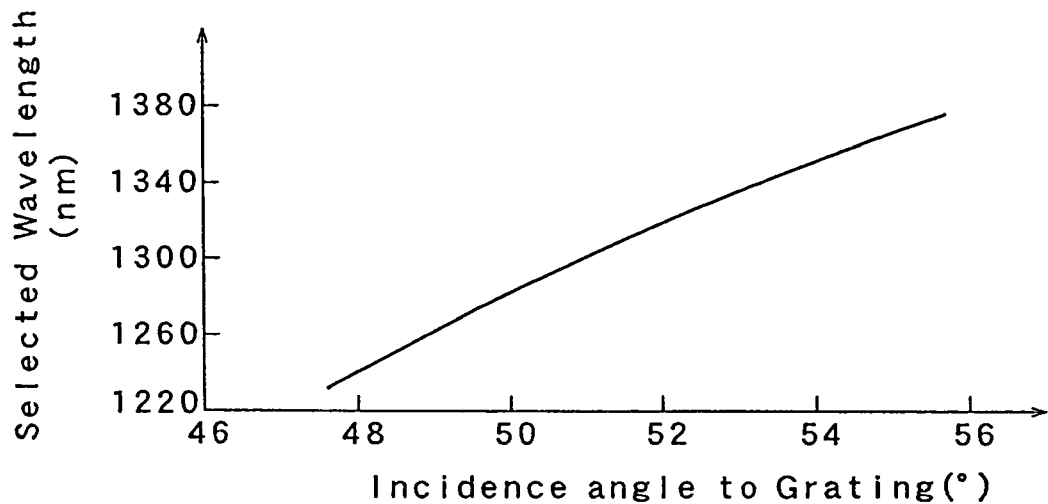
FIG. 6 is a graph showing the wavelength selected by the diffraction grating with respect to the incidence angle on the diffraction grating when no prism is provided.
Figure 7:
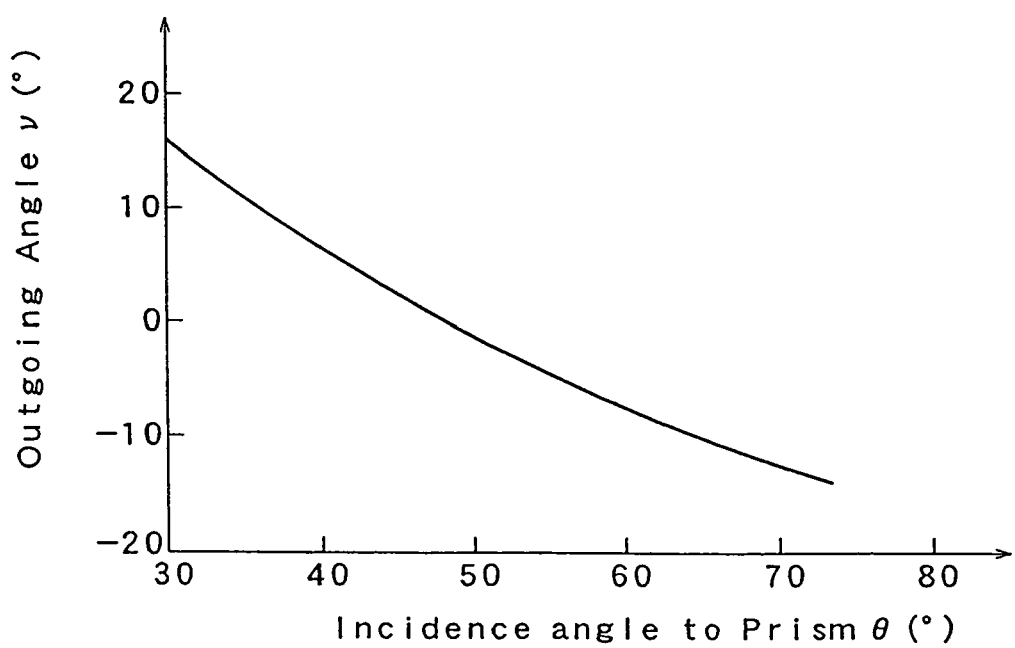
FIG. 7 is a graph showing the relationship between the incidence angle θ on the prism and the outgoing angle ν from the prism when the prism is provided.

FIG. 6 is a graph showing the wavelength selected by the diffraction grating with respect to the incidence angle on the diffraction grating when no prism is provided. This graph is slightly convex with an upward curvature with respect to a straight line, thus exhibiting a sine curve change. FIG. 7 is a graph showing the relationship between the incidence angle θ on the prism 26 and the outgoing angle ν therefrom when the prism is provided. This graph has a property that is convex with a downward curvature. Thus, providing incidence light to the diffraction grating via the prism cancels out these property changes, thus permitting an improvement in the linearity.

Where the refractive index of the prism 26 is n, there exists the following relationship at the incidence portion between the incidence angle θ and the angle φ of refraction inside the prism:

$$n \cdot \sin\phi = \sin\theta \quad (7)$$

There exists the following relationship on the emergence surface of the prism 26 between the incidence angle μ inside the prism and the outgoing angle ν:

$$\sin\nu = n \cdot \sin\mu \quad (8)$$

This incidence angle μ is represented below by the apex angle α of the prism and the incidence angle θ:

$$\mu = \alpha - \theta \quad (9)$$

Combining these formulae (7) to (9) together with the formula (2), the wavelength λ selected by the diffraction grating is represented by a formula below:

$$\lambda = 2\Lambda \sin[\beta + a\sin\{n \cdot \sin(\alpha - a\sin(\sin\theta/n))\}].$$

To indicate this in a frequency, f(θ) is represented by formula below:

$$f(\theta) = \lambda/c = c/2\Lambda \sin[\beta + a\sin\{n - \sin(\alpha - a\sin(\sin\theta/n))\}] \quad (10).$$

Based on this formula, adjusting the apex angle α of the prism and the angle β formed by the prism and the diffraction grating permits optimization so as to be close to linear approximation formula below:

$$f_L(\theta) = A\theta + B \quad (11)$$

where A and B are arbitrary constants, and the linear approximation formula $f_L(\theta)$ is a line closest to the formula (10). The formula (11) shows the line with a minimum peak error in a predetermined frequency range from $f(\theta_1)$ to $f(\theta_2)$.

Figure 8:
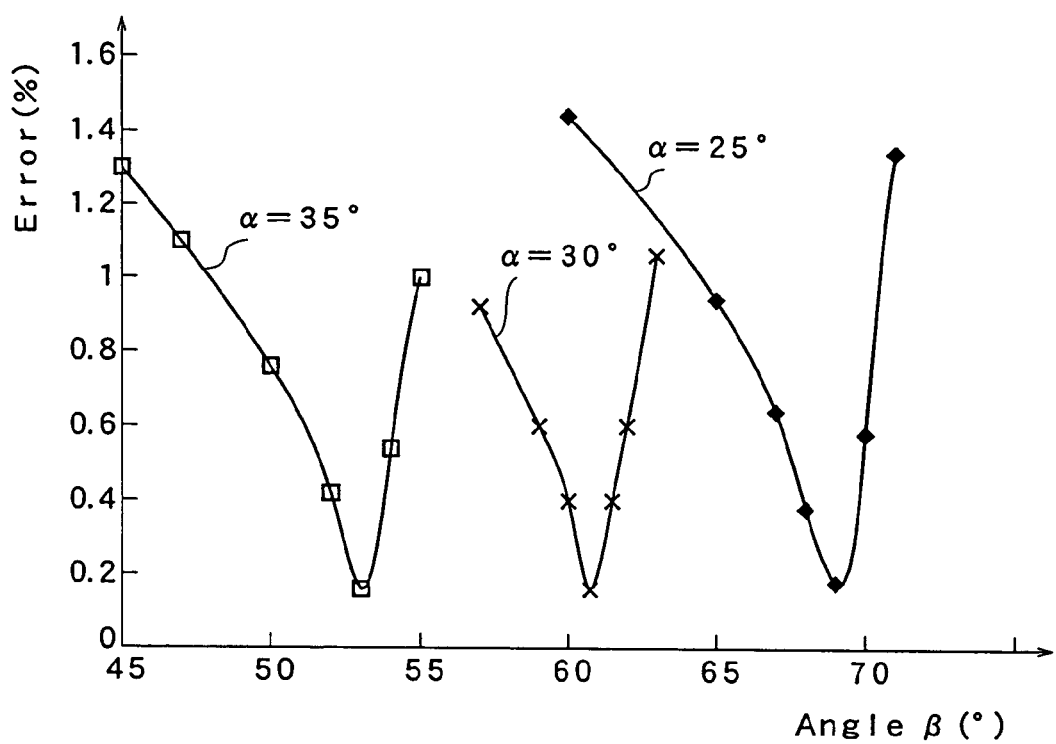
FIG. 8 is a graph showing deviance from a linear approximation formula with respect to the angle β formed by the prism and the diffraction grating with various apex angles α of the prism.

Now, a detailed description will be given on error from the linear approximation with respect to the angles α and β. For example, where the number a of rulings of the diffraction grating is 1200 (lines/mm) (Λ=0.83 μm) and the wavelength band is 1.3 μm band (220–240 THz), FIG. 8 shows error in % of the angle β shown on the horizontal axis from a frequency approximated straight line with angles of α at 25 degrees, 30 degrees, and 35 degrees, respectively. This graph indicates that, when the angle α is appropriately selected, there exists, for any of the angles α, an angle β that maintains a deviance of approximately 0.2% or below.

Now, where the variation range of the incidence angle θ is $\theta_1$ to $\theta_2$, a maximum value $e_{max}$ of an error with respect to the linear approximation formula $f_L(\theta)$ of the formula (11) within a frequency range for a corresponding angle is represented by the formula below:

$$e_{max} = \text{MAX}\{(f_L(\theta) - f(\theta))/(f(\theta_2) - f(\theta_1))\} \quad (12).$$

As can be seen in FIG. 8, selecting the angles α and β permits minimizing the maximum value $e_{max}$ of an error. A smaller maximum value $e_{max}$ is more preferable. In application to a light source of an OCT, a maximum value $e_{max}$ of 0.2% to 0.5% is practically sufficient.

Figure 9:
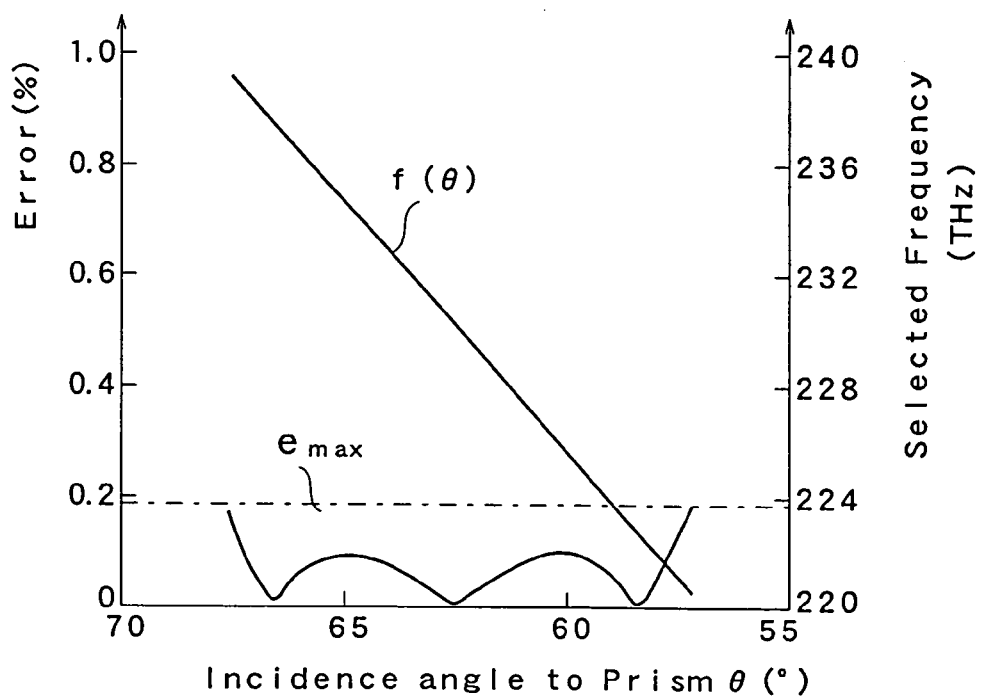
FIG. 9 is a graph showing the error between the oscillation frequency and the linear approximation formula with respect to the incidence angle where the number a of rulings of the diffraction grating is 1200 lines/mm, α is 30 degrees, and β is 60.7 degrees.
Figure 10:
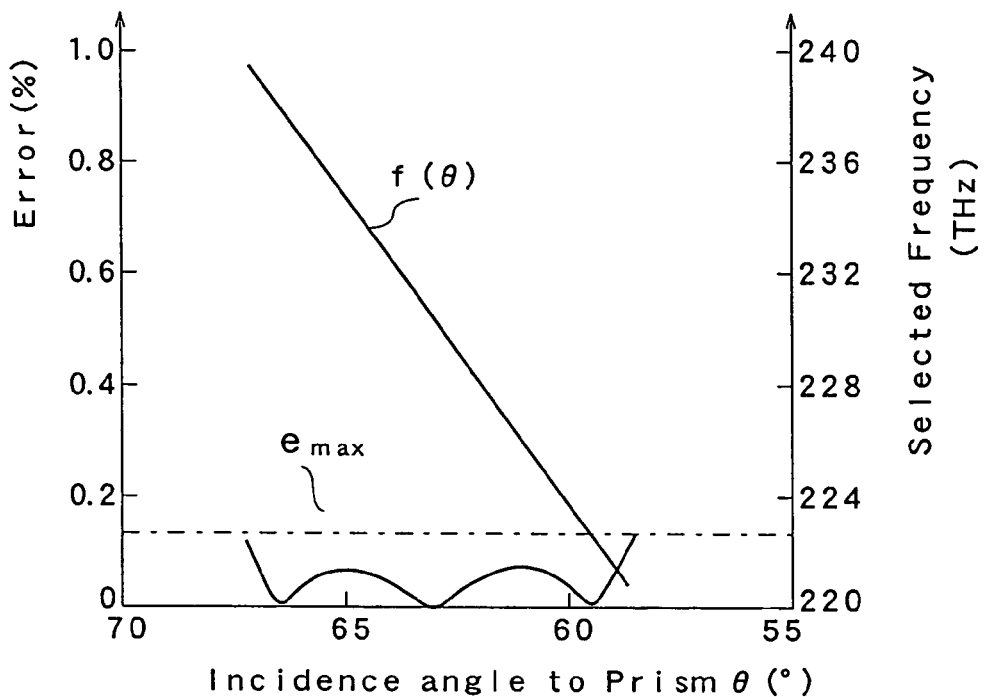
FIG. 10 is a graph showing the error between the oscillation frequency and the linear approximation formula with respect to the incidence angle where the number a of rulings of the diffraction grating is 1100 lines/mm, α is 30 degrees, and β is 55.3 degrees.
Figure 11:
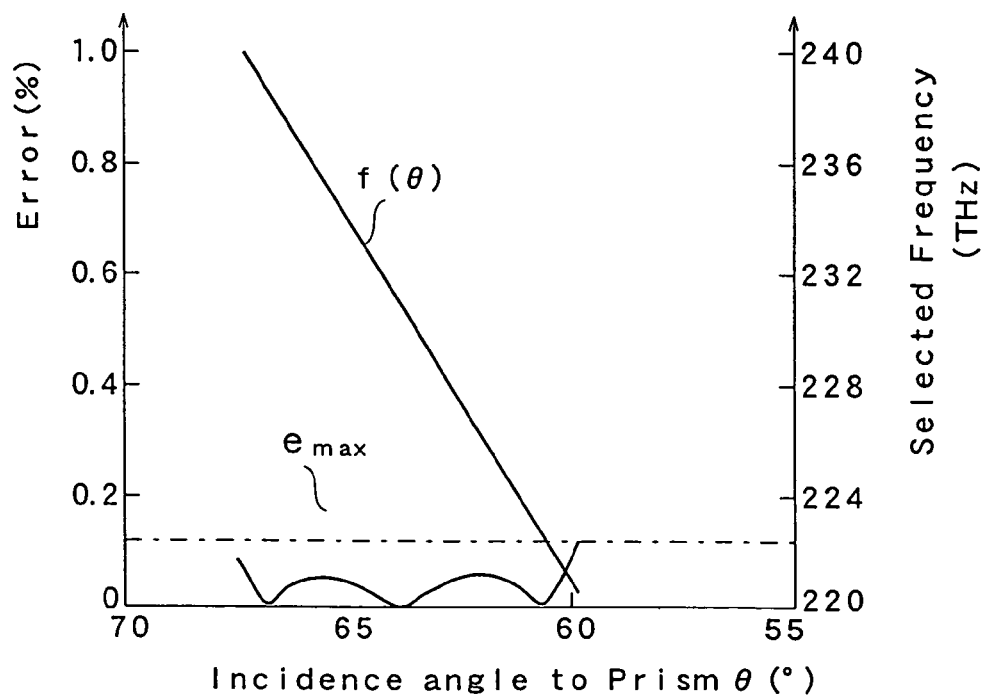
FIG. 11 is a graph showing the error between the oscillation frequency and the linear approximation formula with respect to the incidence angle where the number a of rulings of the diffraction grating is 1000 lines/mm, α is 30 degrees, and β is 50.3 degrees.

FIG. 9 shows an error between the frequency change and the approximated line with respect to the incidence angle θ where the number a of rulings of the diffraction grating is equal to 1200 lines/mm, α is equal to 30 degrees, and β is equal to 60.7 degrees. The maximum value $e_{max}$ in the graph of FIG. 9 which becomes an optimum value and which is represented by a chain line over this frequency band (220 to 240 THz) is 0.19% or below. Adjusting the number a of rulings of the diffraction grating for further optimization over this band 1.3 μm can provide a value still closer to the straight line. FIG. 10 refers to a case where the number a of rulings of the diffraction grating is equal to 1100 lines/mm, α is equal to 30 degrees, and β is equal to 55.3 degrees, in which the maximum value $e_{max}$ becomes 0.14% or below. FIG. 11 refers to a case where the number a of rulings of the diffraction grating is equal to 1000 lines/mm, α is equal to 30 degrees, and β is equal to 50.3 degrees, in which the maximum value $e_{max}$ becomes 0.12% or below. Note that 1000 (lines/mm) or above is a practical range for the number a of rulings of the diffraction grating since a smaller number a of rulings results in a larger half bandwidth.

Figure 12:
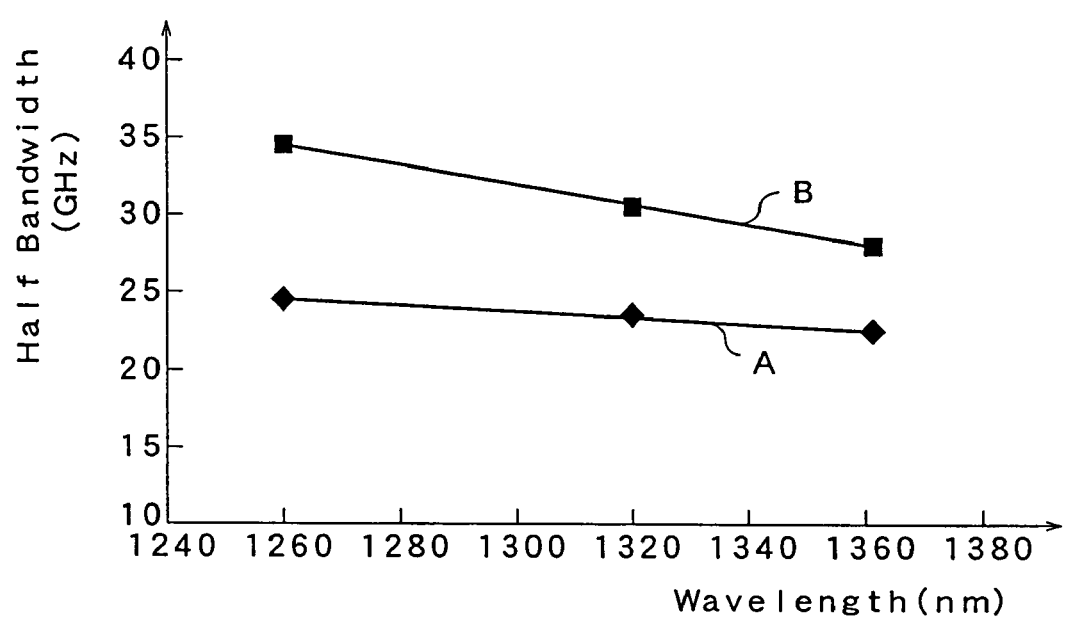
FIG. 12 is a graph showing the relationship between the selected wavelength and the half bandwidth with the prism and without the prism.

Further, as described above, the use of the prism 26 can maintain a half bandwidth change small regardless of a wavelength selected. The line A in FIG. 12 shows the change in the half bandwidth respect to the wavelength using the prism 26. The line B shows the change in the half bandwidth respect to the wavelength when an optical beam is made incident directly on the diffraction grating via the polygon mirror 24 without the prism 26. This graph indicates the half bandwidth with Δf(GHz) and shows an example where the number a of rulings is equal to 1200 lines/mm, α is equal to 30 degrees, and β is equal to 53 degrees, and where the wavelength changes over a range of 1260 to 1360 nm and the beam diameter from the deflection device is 1.2 mm.

In this embodiment, light reflected by the polygon mirror is made incident on the diffraction grating via the prism with its angle altered. Thus, it is not required to use any lens system or the like between these devices, thus permitting an improvement in productivity with simple structure. The deflection angle is equal to the incidence angle on the diffraction grating and corresponds to the variable frequency range. Therefore, the frequency can be changed at high speed by rotating the polygon mirror at high speed.

For the laser light source of the first embodiment, the semiconductor optical amplifier (SOA) is used as a gain medium. On the other hand, to form the gain medium 12, an erbium doped fiber may be provided with erbium ion ($Er^{3+}$) added to a part of an optical fiber loop and a laser diode for fiber excitation that makes pump light incident on the erbium doped fiber and a WDM coupler may be used.

Second Embodiment

Figure 13:
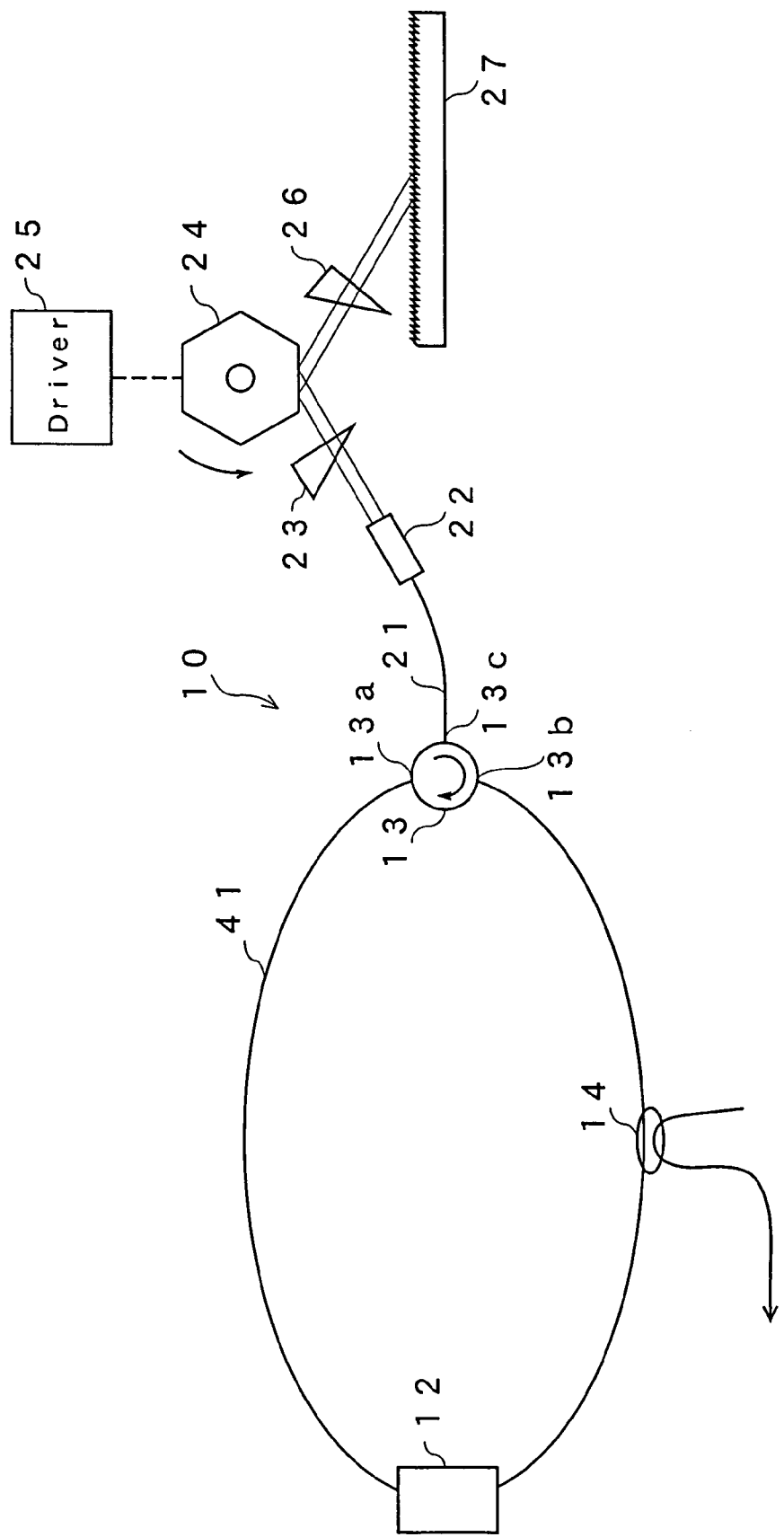
FIG. 13 is a schematic diagram showing a tunable fiber laser light source according to a second embodiment of the invention.

FIG. 13 is a diagram showing a tunable fiber laser light source according to a second embodiment of the present invention. In the present embodiment, a polarization maintaining optical fiber 41 is used for an optical fiber loop to form laser oscillation path. Also in the present embodiment, a semiconductor optical amplifier as a gain medium 12, an optical circulator 13, and an optical coupler 14 are used. In the present embodiment, the polarization maintaining fiber 41 keeps the polarization plane of light oscillated while traveling around the loop constant in a predetermined direction, thereby, no polarization controller is required. Other structure of this embodiment is same as that of the first embodiment; thus, the same effect can be provided with relatively simple structure.

Third Embodiment

Figure 14:
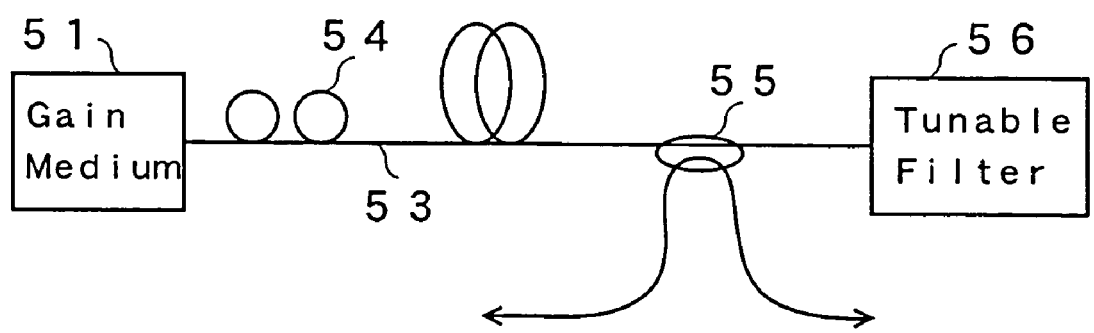
FIG. 14 is a schematic diagram showing a tunable fiber laser light source according to a third embodiment of the invention.
Figure 15:
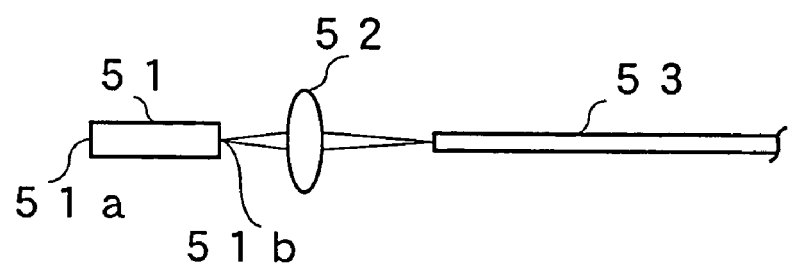
FIG. 15 is a diagram showing the details of a gain medium according to the embodiments.

Next, a description will be given on a third embodiment of the present invention, referring to FIGS. 14 and 15. In the present embodiment, instead of providing an optical fiber in the form of a loop, a gain medium, an optical fiber, and a tunable filter part are used to form an optical resonator. As a gain medium 51, a semiconductor optical amplifier (SOA), a Fabry-Perot laser diode (FPLD), a Super Luminescent Diode (SLD), or the like is used. As shown in FIG. 15, the gain medium 51 has one surface 51a provided as a high reflection film having a reflectance of, for example, approximately 80 to 100% and has the other surface 51b provided as a non-reflection film. Light transmitted through the surface 51b is connected to an optical fiber 53 via a collimate lens 52. The optical fiber 53 is connected to a polarization controller 54 with the other end thereof provided with the aforementioned tunable filter 56 of the first embodiment. The tunable filter 56 is, as is the case with the embodiment described above, composed of an optical beam deflector formed with the polygon mirror 24 and the like, and the diffraction grating 27. Therefore, the optical fiber forms an optical path whose both ends are located at the diffraction grating 27 and the surface 51a (mirror), respectively. Here, the optical fiber 53 is fitted with an optical coupler 55 so that a part of laser light emerges outside. The optical fiber 53 is used to provide a sufficiently large optical path length. The length of the optical fiber 53 needs to be selected which permits a plurality of longitudinal modes to be included in the full width at half maximum of the diffraction grating 27. The number of these longitudinal modes is preferably 10 or above, and more preferably 100 or above; therefore, the larger number of the longitudinal modes is more preferable. However, since the optical fiber needs to be elongated to increase longitudinal modes, an optical fiber having a length of from several meters to several tens of meters is used in practice.

The surface 51a of the gain medium 51 may be provided as a non-reflection film, and a total reflection mirror may be provided at the outer side thereof. In this case, the mirror and the tunable filter 56 forms an optical path. The polarization controller 54 can also be omitted in this case by providing the optical fiber 53 as a polarization maintaining optical fiber.

Fourth Embodiment

Figure 16:
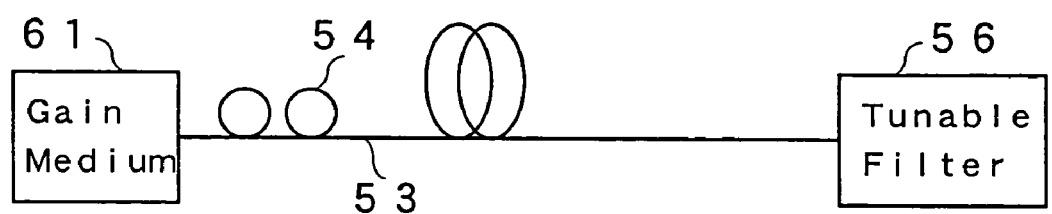
FIG. 16 is a schematic diagram showing a tunable fiber laser light source according to a fourth embodiment of the invention.
Figure 17:
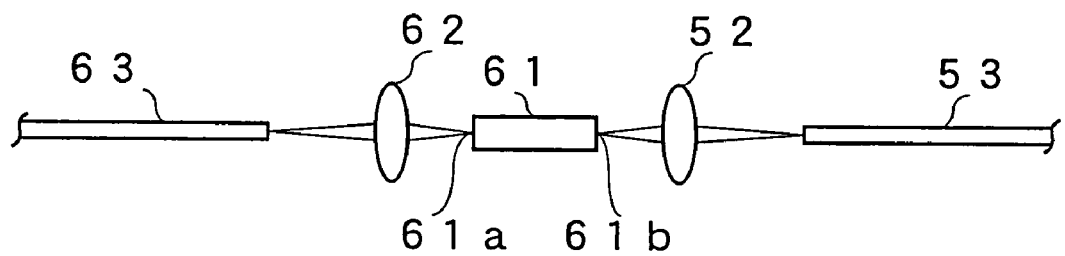
FIG. 17 is a diagram showing the construction of the gain medium and its surrounding area according to the embodiments.

Next, a description will be given on a fourth embodiment of the present invention with FIGS. 16 and 17. In this embodiment, as shown in FIG. 16, a gain medium 61 has one surface 61b provided as a non-reflection film and has the other surface 61a having a reflectance of as low as approximately 10%, so that oscillation output light is extracted from this reflection surface 61a. To the surface 61b of the gain medium, a collimate lens 62 and an optical fiber 63 are fitted. Thus, no optical coupler is required for extracting light. Other structure is similar to that of the third embodiment.

In the embodiments described above, the polygon mirror and the driver are used as the optical beam deflector; however, any member may be used as long as it permits an angle of reflection to change at a fixed angular speed.

The present invention is applicable to various analyzers, for example to a high resolution medical image diagnostic device for lower epidermis in medical practice. The laser light source of the present invention can be used to measure distortion by use of a fiber grating sensor.

In the embodiments described above, the optical fiber is used as a optical path; however, the optical path can be embodied with appropriate space or a light waveguide.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application No. 2005-227543 filed on Aug. 5, 2005 is hereby incorporated by reference.

What is claimed is:

1. A tunable laser light source comprising:
an optical path for laser oscillation;
a gain medium which is provided in the optical path and which has a gain in an oscillating wavelength; and
a tunable optical filter which is arranged in said optical path and which selects a continuously changing wavelength,
wherein said tunable optical filter comprises:

an optical beam deflector for periodically deflecting an optical beam over a predetermined rage at a constant angular speed;

a prism on which light deflected by said optical beam deflector is made incident; and a diffraction grating on which light emerging from said prism is made incident and which reflects light of a selected wavelength in a direction same as an incidence direction, the selected wavelength changing in accordance with an incidence angle, and wherein values of an apex angle α of said prism and an angle β formed by said prism and said diffraction grating are selected so that, when an oscillation frequency is represented as a function $f(\theta)$ of an incidence angle θ on said prism, a difference thereof from a linear approximation formula $f_L(\theta)$ is smaller than that when said prism is not used.

2. The tunable laser light source according to claim 1, when said incidence angle θ changes in an angle range from $\theta_1$ to $\theta_2$, and when a maximum value $e_{max}$ of the error between said linear approximation formula and the oscillation frequency $f(\theta)$ is represented by a formula:

$$e_{max} = MAX\{(f_L(\theta) - f(\theta))/(f(\theta_2) - f(\theta_1))\},$$

wherein said linear approximation is a linear approximation formula which has a smallest maximum value $e_{max}$ in the angle range, and wherein said apex angle α of the prism and said angle β formed by the prism and the diffraction grating are selected so that the maximum value $e_{max}$ becomes at most 0.2%.

3. The tunable laser light source according to claim 2, wherein, for said diffraction grating, a number of rulings is selected so that said maximum value $e_{max}$ of the error becomes smallest in the oscillation frequency range of $f(\theta_1)$ to $f(\theta_2)$.

4. The tunable laser light source according to claim 1, wherein said optical path is composed of a mirror and said diffraction grating of said tunable optical filter.

5. The tunable laser light source according to claim 1, wherein said optical path is an optical loop formed in a shape of a loop, and wherein said tunable laser light source further comprises:

an optical coupler connected to said optical loop and extracts a part of light passing through said optical loop; and an optical circulator having a first to a third terminals and controls a direction of light incident on each of the terminals, said first and second terminals being connected to said optical loop, said third terminal being connected to said tunable optical filter.

6. The tunable laser light source according to claim 5, wherein said optical loop is formed by an optical fiber.

7. The tunable laser light source according to claim 6, wherein said optical fiber is a polarization maintaining optical fiber.

8. The tunable laser light source according to claim 1, wherein the optical beam deflector of the tunable filter comprises:

a polygon mirror which is arranged on an axis of light emitted by the optical fiber and which has a plurality of reflection surfaces for changing an angle of reflection of light through rotation; and a driver which controls the angle of reflection of light by rotating said polygon mirror.

9. The tunable laser light source according to claim 1, wherein said prism of the tunable filter has a larger magnification ratio as the selected wavelength decreases.

10. The tunable laser light source according to claim 1, wherein said tunable laser light source further comprises:

a light receiving element for receiving primary reflected light from an end portion of said diffraction grating within a diffraction range.

11. The tunable laser light source according to claim 10, wherein said tunable laser light source further comprises:

a band pass filter for transmitting only a wavelength component of reflected light from said end portion disposed in front of said light receiving element.

* * * * *